United States Patent [19]

Lindner

[11] Patent Number: 4,788,079
[45] Date of Patent: Nov. 29, 1988

[54] METHOD OF MAKING HAZE-FREE TIN OXIDE COATINGS

[75] Inventor: Georg H. Lindner, KV Vlissingen, Netherlands

[73] Assignee: M&T Chemicals Inc., Woodbridge, N.J.

[21] Appl. No.: 116,423

[22] Filed: Nov. 3, 1987

Related U.S. Application Data

[63] Continuation of Ser. No. 793,023, Oct. 30, 1985, abandoned.

[51] Int. Cl.$^4$ ............................................. C03C 17/22
[52] U.S. Cl. .................... 427/166; 427/109; 427/126.2; 427/126.3; 427/255; 427/255.3
[58] Field of Search ............ 427/166, 164, 109, 126.2, 427/126.3, 255, 255.3

[56] References Cited

U.S. PATENT DOCUMENTS

| | | | |
|---|---|---|---|
| 3,420,693 | 1/1969 | Scholes et al. | 427/250 |
| 3,944,684 | 3/1976 | Kane et al. | 427/255 |
| 4,265,974 | 5/1981 | Gordon | 427/166 |
| 4,547,400 | 10/1985 | Middleton et al. | 427/166 |
| 4,548,836 | 10/1985 | Middleton et al. | 427/166 |

*Primary Examiner*—Janyce Bell
*Attorney, Agent, or Firm*—S. A. Marcus; W. Katz

[57] ABSTRACT

Haze-free tin oxide coatings are made from an organotin compound which ordinarily gives only hazy coatings. The improvement comprises first forming an undercoat of a haze-free tin oxide film on a substrate, preferably by decomposition of monophenyltin trichloride. Thereafter the tin oxide overcoating assumes the haze-free characteristics of the undercoat film.

8 Claims, 1 Drawing Sheet

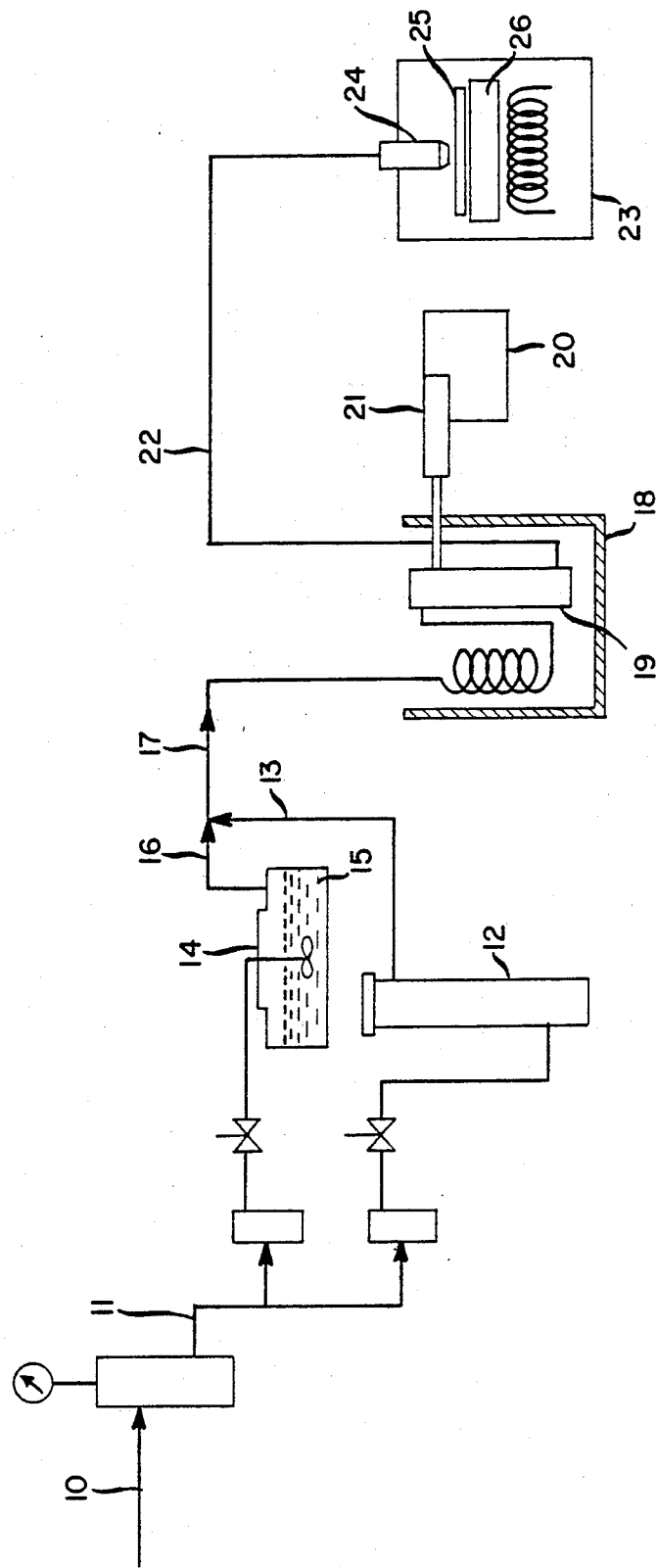
FIGURE

METHOD OF MAKING HAZE-FREE TIN OXIDE COATINGS

This is a continuation of co-pending application Ser. No. 793,023 filed on Oct. 30, 1985, now abandoned.

BACKGROUND OF THE INVENTION

1. Field of the Invention

This invention relates to haze-free tin oxide coatings, and more particularly, to a method of making such coatings by interposing an improved undercoat film between the substrate and the tin oxide coating.

2. Description of the Invention

There is a demand for glass products, in particular, flat glass, having a tin oxide coating of high optical quality which modifies the radiation transmitting characteristics of the product but causes little or no diffusion of transmitted light. Any significant amount of light diffusion within a transmitted product is apparent as haze, which is detrimental in commercial use.

In the prior art it is recognized that the appearance of haze in tin oxide coatings formed on glass by exposure to tin compounds can be prevented or reduced by application of an intervening coating of suitably selected composition. For example, U.S. Pat. No. 2,617,741 proposes to provide a protective layer preceding the formation of the tin oxide coating by spraying the heated glass with a saturated or relatively concentrated aqueous solution of a suitable soluble metal salt, particularly the acetates of copper, aluminum, lead, zinc, iron, nickel, cobalt, thallium, silver or titanium.

Similarly, Terneu in U.S. Pat. No. 4,329,379, describes an undercoat of a metal oxide formed by decomposition of the acetylacetonate of titanium, nickel or zinc on which a tin oxide overcoat free from perceptible haze can be formed.

Gordon, in U.S. Pat. Nos. 4,187,336 (and 4,206,252) uses a tin oxide coating to provide a non-iridescence on glass structure which is described as being free of visible haze. In this structure, the haze which ordinarily would appear in the tin oxide coating is reduced by first depositing on the window glass an amorphous layer of $SiO_2$, $Si_3N_4$, $GeO_2$, $Al_2O_3$, or silicon oxy-nitride, or mixtures thereof with each other, or with other metal oxides. However, Gordon states that if this layer contains a large proportion of the metal oxides, $Ga_2O_3$, $ZnO$, $In_2O_3$, or $SnO_2$, then haze formation is likely.

U.S. Pat. Nos. 4,547,400 and 4,548,836 describe the use of an undercoat of tin oxide formed from a chlorine-free organic/tin ion-containing compound on which a haze-free doped tin oxide layer can be formed.

The art also recognizes the advantage of using certain tin compounds such as monobutyltin trichloride as a precursor for the tin oxide coating. However, many of these tin compounds will produce hazy coatings unless formed under very restrictive and disadvantageous deposition conditions.

Accordingly, it is an object of this invention to provide an improved method of making haze-free tin oxide coatings.

Another object of this invention is to form a haze-free, tin oxide overcoat on glass from a precursor tin compound under a wide range of deposition conditions.

A specific object herein is to form a haze-free conductive tin oxide by using an improved undercoat film between the glass and the tin oxide coating.

A feature of the invention is the use of a haze-free tin oxide undercoat film on which haze-free tin oxide coatings may be formed.

A particular feature of the invention is the use of monophenyltin trichloride to form a haze-free tin oxide undercoat on glass, and, on which haze-free, conductive tin oxide coatings may be formed from tin compounds under process conditions which ordinarily would give hazy coatings if deposited directly on glass.

These and other objects and features of the invention will be made apparent from the following more particular description of the invention.

SUMMARY OF THE INVENTION

In accordance with the invention, there is provided herein an improved method of making haze-free tin oxide coatings on glass from an organotin source which usually forms hazy coatings except at restrictive and disadvantageous deposition conditions.

The method of the invention is characterized by providing a haze-free tin oxide undercoat film between the glass and the tin oxide coating whereupon the overcoat tin oxide coating assumes the haze-free characteristics of the undercoat film.

The undercoat tin oxide film in this invention preferably is prepared by chemical vapor deposition of monophenyltin trichloride, which provides a haze-free coating under a wide range of process conditions.

The overcoat haze-free tin oxide then may be deposited from tin compound which are known to form tin oxide coatings by vapor deposition. If desired, conductive tin oxide coating may be formed by including a dopant with the tin compound.

BRIEF DESCRIPTION OF THE DRAWING

In order to better understand the invention reference will be made to the accompanying drawing in which:

The FIGURE is a schematic diagram of an apparatus for carrying out the coating process of the invention.

DETAILED DESCRIPTION OF THE INVENTION

Referring now to the FIGURE, there is shown a diagrammatic representation of an apparatus suitable for carrying out the process of the present invention. Accordingly, a carrier gas 10, which includes oxygen, is metered through a feed line 11 at a predetermined flow rate through an air dryer tower 12 to provide a stream 13 of dry air. A separate air stream may be directed through a humidifier 14 containing a suitable quantity of water 15 to provide a wet air stream 16 at a desired relative humidity. Thereby an air stream 17, either dry or wet, may be passed through an evaporator 18 containing vessel 19 for holding liquid monophenyltin trichloride. The liquid is supplied to evaporator 18 by syringe pump 20 and syringe 21. The air stream is heated from an oil bath (not shown) to a desired vaporization temperature.

The vaporized liquid monophenyltin trichloride in the air stream 22 travels to a deposition chamber 23 having a coating nozzle 24 in which a glass substrate 25 is mounted on a plate 26 heated to a predetermined temperature. After deposition of the haze-free tin oxide undercoat on the glass substrate, the gaseous by-products of the deposition are exhausted.

To prepare the undercoat film from monophenyltin trichloride, the glass substrate suitably is held at a temperature of about 450° to 650° C., preferably 500° to 600° C.

The vaporization temperature of liquid monophenyltin trichloride in the process suitably ranges from about 100° to 400° C., preferably about 120° to 175° C.

The carrier gas is an oxygen-containing gas which suitably may be air, or a mixture of oxygen and an inert gas, and is preferably air.

The carrier gas may be dry or wet; preferably the water vapor concentration is less than 10 moles of water per mole of monophenyltin trichloride.

The carrier gas velocity suitably ranges from about 0.1 to about 10 m per sec.

The concentration of monophenyltin trichloride in the carrier gas suitably ranges from about $10^{-5}$ to $10^{-2}$ moles of monophenyltin trichloride per mole of carrier gas.

In general, the process of the invention produces a haze-free tin oxide undercoat which has less than 1% haze and greater than 80% visible transmission, and which is obtained in a desired thickness within a rapid deposition time.

The haze-free tin oxide coatings of the invention then are deposited on the haze-free undercoat film from organotin compounds which ordinarily will produce hazy coatings when deposited directly on glass at elevated glass temperatures. For example, such compounds as tin tetrachloride, monoalkyltin trichlorides, e.g. monobutyltin trichloride, dibutyltin diacetate, dimethyltin dichloride, and the like, may be used. Monobutyltin trichloride is a preferred source compound.

A dopant which imparts conductivity to the tin oxide overcoat may be included in the tin coating composition if desired. Such dopants include trifluoroacetic acid, trifluoroacetic anhydride, ethyl trifluoroacetate, pentafluoropropionic acid, difluorodichloromethane, monochlorodifluoromethane, 1,1-difluoroethanol, and the like.

A preferred conductive tin oxide overcoating composition is monobutyltin trichloride and trifluoroacetic acid, suitably in a composition range of about 70–99 wt. % of the organotin compound and 1–30 wt. % of the dopant.

The undercoat tin oxide film suitably has a thickness of at least 10 nm, preferably 30 nm. The tin oxide overcoating can have any desired thickness; usually for conductive coatings on glass it is about 150–250 nm.

The haze content of the tin oxide film and coatings herein are determined from Gardner hazemeter measurements on glass slides coated with tin oxide, according to ASTM D1003-61 (Reapproved 1977)-Method A.

The visible transmittance was measured on a UV/vis spectrophotometer over the 400–800 nm region, versus air, and the % $T_{vis}$ was averaged over the wavelengths.

The film thickness was measured by the beta-backscatter method according to British Standards Institution method BS5411: Part 12, 1981, ISO 3543-1981.

The advantages of the invention can be more readily appreciated by reference to the following specific examples in which a tin oxide overcoat is formed on glass which has been provided with an undercoat film obtained from monophenyltin trichloride (Table I); and of conductive tin oxide coatings which have been provided with an undercoat film from monophenyltin trichloride over a range of process conditions (Table II).

TABLE I

Haze-Content of Tin Oxide Structures on Glass Obtained Using a Tin Oxide Undercoat from Monophenyltin Trichloride (MPTC) and a Tin Oxide Overcoat from Monobutyltin Trichloride (MBTC)

| | | | % Haze | | |
|---|---|---|---|---|---|
| Example | Conc. moles/ltr. | Substrate Temp. (°C.) | Undercoat Film (MPTC) | Layer Directly on Glass (MBTC) | Uncoated Glass |
| 1 | 0.079 | 600 | 0.90 | 5.5 | |
| 2 | " | 550 | 0.75 | 2.7 | |
| 3 | " | 500 | 0.75 | 1.1 | 0.75 |

TABLE II

Haze-Content of Conductive Tin Oxide Coatings on Glass Obtained Using a Tin Oxide Undercoat from MPTC and a Conductive Tin Oxide Overcoat from MBTC Under Different Process Conditions

| | | | % Haze | | |
|---|---|---|---|---|---|
| Example | Conc. moles/ltr. | Substrate Temp. (°C.) | Undercoat Film (MPTC) | Conductive Layer Directly on Glass (MBTC) | Uncoated Glass |
| 4 | 0.119 | 600 | 0.90 | 5.4 | |
| 5 | " | 550 | 0.75 | 2.6 | |
| 6 | " | 500 | 0.75 | 1.1 | |
| 7 | 0.159 | 600 | 0.75 | 5.2 | |
| 8 | " | 500 | 0.75 | 1.0 | 0.75 |

Dew point, Exs. 1–3, 2.4; Exs. 4–8, 12.0; vaporization temp., Exs. 1–8, 157° C.; thickness of MPTC coatings, Exs. 1–8, 30 nm; MBTC, 190 nm; deposition times, Exs. 1–8, MPTC 6–22 seconds, Exs. 1–3, MBTC, 7–9 seconds; visible transmittance, Exs. 1–8, MPTC, 80%; Exs. 1–3, MBTC, 75%;

The tin oxide coatings obtained using monophenyltin trichloride as an undercoat are haze free under a wide range of process conditions, and at certain substrate temperatures show a value substantially equal to that of uncoated glass. On the other hand, tin oxide coatings made from monobutyltin trichloride directly on glass are hazy under all process conditions.

The reason that haze-free tin oxide coatings can be produced using haze-free monophenyltin trichloride as an undercoat is not well understood at present. However, this effect may be related to the minimum of surface voids, or pitting, observed in undercoat tin oxide film made from this compound.

While the invention has been described with reference to particular embodiments thereof, it will be understood that changes and modifications may be made which are within the skill of the art. It is intended to be bound only by the claims which follow hereinafter.

What is claimed is:

1. A method of forming haze-free tin oxide coatings on a substrate from an organotin compound which usually forms only hazy films under advantageous deposition conditions which comprises:

forming a haze-free tin oxide undercoat film on said substrate by contacting said substrate at a temperature of 450° C. to 650° C. with a vapor of monophenyltin trichloride and thereafter depositing a desired tin oxide overcoat from the thermal decomposition of a tin compound selected from the group of tin tetrachloride, dibutyltin diacetate, dimethyl tin chloride and monobutyltin trichloride whereby the tin oxide overcoat assumes the haze-free characteristics of said undercoat.

2. A method according to claim 1 wherein the substrate is glass.

3. A method according to claim 1 wherein said tin oxide overcoat is a conductive tin oxide coating.

4. A method according to claim 1 wherein both said tin oxide undercoat and said tin oxide overcoat have a haze of less than 1%.

5. A method according to claim 3 wherein said conductive tin oxide overcoat is formed from a monoalkyltin trichloride and a fluorine dopant therewith.

6. A method according to claim 5 wherein said conductive tin oxide coating is deposited from monobutyltin trichloride and trifluoroacetic acid.

7. A method according to claim 1 wherein said undercoat has a thickness of at least 10 nm.

8. A method according to claim 1 wherein said overcoat tin oxide is made by chemical vapor deposition from monobutyltin trichloride.

* * * * *